United States Patent [19]

Arbeiter

[11] Patent Number: 4,694,413

[45] Date of Patent: Sep. 15, 1987

[54] COMPACT-STRUCTURE INPUT-WEIGHTED MULTITAP DIGITAL FILTERS

[75] Inventor: James H. Arbeiter, Hopewell, N.J.

[73] Assignee: RCA Corporation, Princeton, N.J.

[21] Appl. No.: 632,467

[22] Filed: Jul. 19, 1984

[51] Int. Cl.[4] .............................................. G06F 7/38
[52] U.S. Cl. .................................................. 364/724
[58] Field of Search ......................................... 364/724

[56] References Cited

U.S. PATENT DOCUMENTS

| 4,020,332 | 4/1977 | Crochure et al. | 364/724 |
| 4,149,259 | 4/1979 | Kowalski | 364/724 |
| 4,218,752 | 8/1980 | Hewes et al. | 364/724 |

OTHER PUBLICATIONS

*Multirate Digital Signal Processing* by C. Rochiere, et al., Prentice-Hall, Inc., 1983, pp. 79–88.
"The Laplacian Pyramid as a Compact Image Code," by Burt, et al., *IEEE Transactions on Communications*, vol. Com-31, No. 4, 4/83, pp. 532–540.

*Primary Examiner*—Archie E. Williams, Jr.
*Assistant Examiner*—Dale M. Shaw
*Attorney, Agent, or Firm*—Joseph S. Tripoli; Allen LeRoy Limberg

[57] ABSTRACT

The number of bits per digital sample that is required to be stored in each of one or more delay means of an input-weighted multitap digital filter is reduced with respect to that required by the prior art. The savings in storage hardware becomes more and more significant as the number of samples stored in each delay means becomes larger and larger. A plurality of filter delay means, each storing as many as 800 samples, are used in vertical filters of image processors operating in real time on horizontally scanned two-dimensional images, such as television images.

11 Claims, 16 Drawing Figures

Q-BITS = 8 BITS

| S-SAMPLE DELAY MEANS | #-BITS PER SAMPLE |
|---|---|
| 402 | 4 |
| 404 | 6 |
| 406 | 7 |
| 408 | 8 |
| 410 | 8 |
| 412 | 8 |

*Fig. 5b*

Q-BITS = 8 BITS

| S-SAMPLE DELAY MEANS | #-BITS PER SAMPLE |
|---|---|
| 602 | 4 |
| 606 | 6 |
| 610 | 7 |

POLYPHASE I

| S-SAMPLE DELAY MEANS | #-BITS PER SAMPLE |
|---|---|
| 604 | 5 |
| 608 | 7 |
| 612 | 7 |

POLYPHASE II

*Fig. 8b*

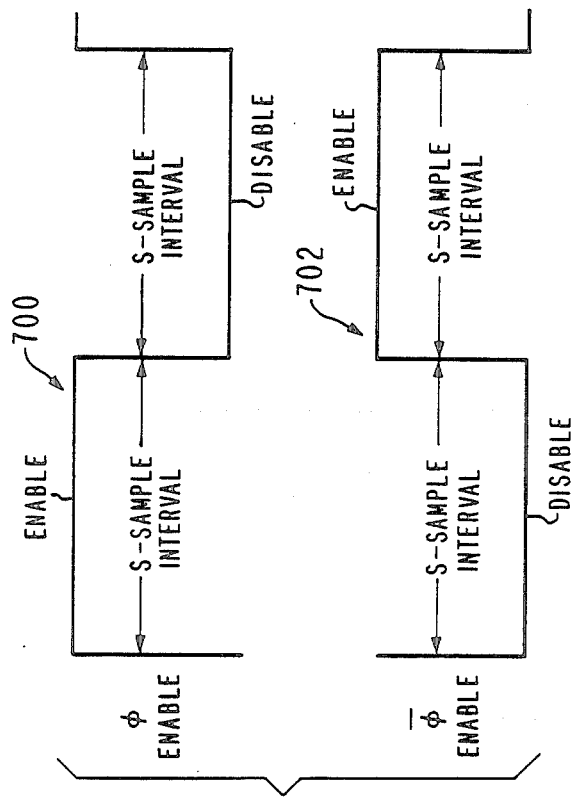
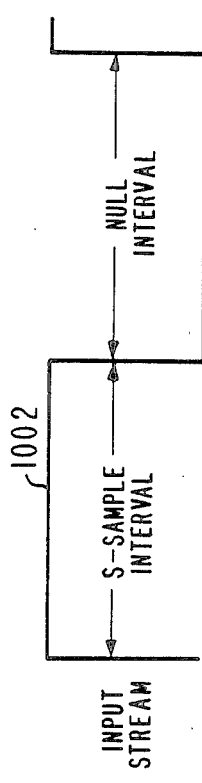
Fig. 7
Fig. 10
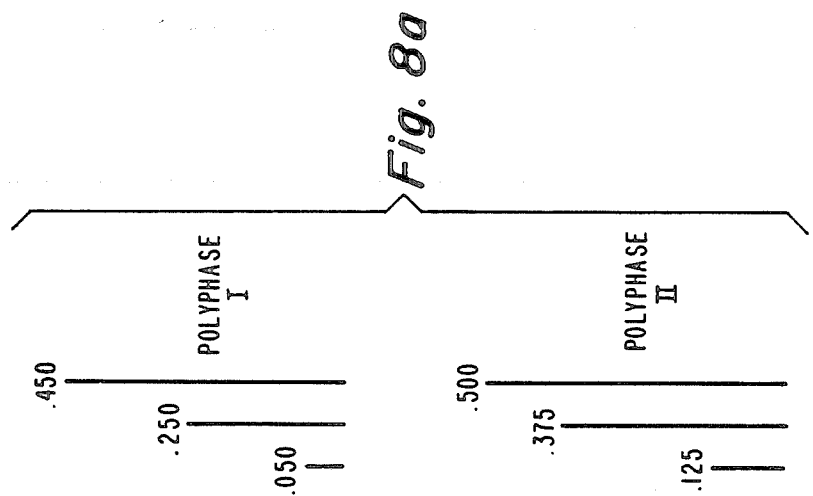
Fig. 8a

COMPACT-STRUCTURE INPUT-WEIGHTED MULTITAP DIGITAL FILTERS

BACKGROUND OF THE INVENTION

1. Field of the Invention:

This invention relates to improved structure for input-weighted multitap digital filters, which improved structure input-weighted filters are particularly suitable for image processing, in real time, scanned two-dimensional images, such as television images.

2. Description of the Prior Art:

Reference is made to co-pending U.S. Pat. No. 4,674,125 entitled "Real-Time Hierarchal Pyramid Signal Processing Apparatus"; issued June 16 1987 to C. R. Carlson, J. H. Arbeiter and R. F. Bessler; and assigned to RCA Corporation. This Carlson et al. patent discloses real-time hierarchal pyramid signal processing apparatus which employs pipe-line architecture for analyzing in delayed real time, inter alia, the two-dimensional spatial frequency spectrum of television images defined by a temporal video signal, and for synthesizing in delayed real time such a temporal video signal from the analyzed frequency spectrum thereof. In particular, the signal processing apparatus disclosed in this co-pending Carlson et al. application is capable of implementing an algorithm, developed by Dr. Peter J. Burt (hereinafter referred to as the "Burt Pyramid") by means which include many digital convolution filters, decimators, expanders, and interpolation filters, all operating on a stream of multibit (e.g., 8-bit) digital signal samples. In the past, the total amount of hardware required for the structure of such digital convolution filters, decimators, expanders and interpolation filters was quite large and, hence, relatively expensive.

SUMMARY OF THE INVENTION

The present invention is directed to a structural improvement in an m-tap input-weighted digital filter (where m is a first integer of three or more). The digital filter is responsive to an input stream of successive digital samples for deriving a filtered output stream of successive digital samples. Each of the input and output digital samples is defined by Q-bits (where Q is a second given integer of three or more). Further, the relative weight of the first of the m taps of the filter is no greater than one-fourth; and at least each of a subset of the m taps that includes the first of the m taps has individually associated therewith a delay means capable of storing a successive digital samples for a given time interval (where S is a third given integer). In accordance with the structural improvement of the present invention, at least the delay means individually associated with the first of the m taps is capable of storing digital samples defined by no more than Q'-bits (where Q' can be any integer having a value that is smaller than that of the second given integer Q). Because Q' is smaller than Q, there is a reduction in the amount of hardware required to implement the improved input-weighted filter of the present invention. The amount of this reduction in hardware (and hence the reduction in the expense of the filter) becomes more and more significant as the value of the integer S (i.e., the number of successive samples that each delay means is capable of storing) becomes larger and larger. In addition, one of the species of the present invention is suitable for use as an embedded convolution filter-decimator and another of the species of the present invention is suitable for use as an embedded expander-interpolation filter.

BRIEF DESCRIPTION OF THE DRAWING

FIG. 5b is a chart showing the minimum number of bits per digital sample required by each of the S-sample delay means of the input-weighted filter of FIG. 4;

FIG. 7 is a timing diagram of two respective enable signals employed by the convolution filter decimator of FIG. 6;

FIG. 8a is a diagram showing the maximum normalized absolute values of the respective inputs to each of the respective S-sample delay means of the two polyphase filters of FIGS. 6 and 9;

FIG. 8b is a chart showing the minimum number of bits per digital sample required by each of the respective S-sample delay means of the two polyphase filters of FIGS. 6 and 9;

FIG. 10 is a timing diagram of the input stream of successive digital samples applied to the expander interpolation filter of FIG. 9.

DESCRIPTION OF THE PREFERRED EMBODIMENT

Figure 1A:
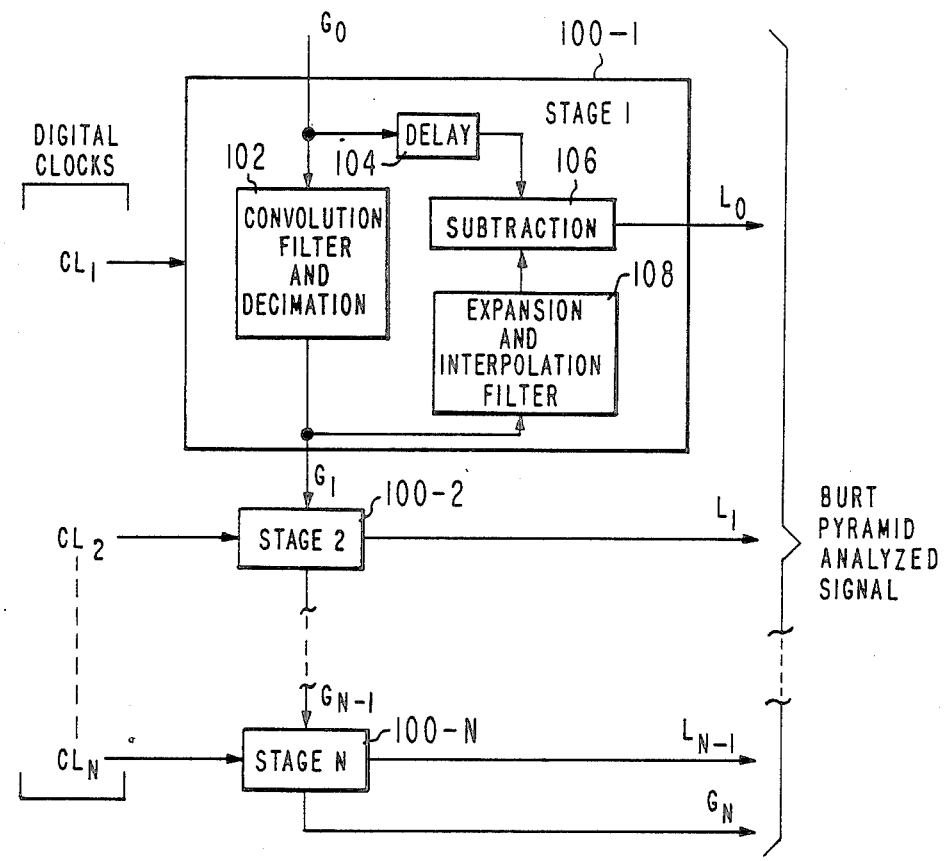
FIGS. 1a and 1b are, respectively, functional block diagrams of the types of delayed real time Burt Pyramid analyzer and Burt Pyramid synthesizer disclosed in the aforesaid co-pending Carlson et al. patent application.

The real-time Burt Pyramid analyzer disclosed in the aforesaid co-pending Carlson et al. patent application is shown in the FIG. 1a functional diagram. As indicated in FIG. 1a, the analyzer is comprised of pipeline of generally similar sampled-signal translation stages 100-1, 100-2 . . . 100-N. Each of the respective stages operates at a sample rate determined by the value of the digital clock $CL_1$, $CL_2$ . . . $CL_N$ individually applied thereto. The value of the clock applied to any particular one of the stages is lower than the value of the clock applied to any stage that precedes it. Preferably, the value of each of the clocks of stages 100-2 . . . 100-N is one-half of the clock of the immediately preceding stage. In the following description it will be assumed that this preferable relationship among the clocks $CL_1 \ldots CL_N$ is the case.

As indicated in FIG. 1a, stage 100-1 is comprised of convolution filter and decimation means 102, delay means 104, substraction means 106 and expansion and interpolation filter means 108. An input stream of digital samples $G_0$, having a sample rate equal to the value of clock $CL_1$ is applied through convolution filter and decimation means 102 to derive an output stream of digital samples $G_1$ at a sample rate equal to the value of clock $CL_2$. $G_0$ is a temporal signal, such as a video signal, that may represent a scanned 2-D image, such as a television image. The convolution filter has a low pass function that reduces the center frequency of each image dimension represented by $G_1$ to one-half of the center-frequency of the corresponding dimension represented by $G_0$. At the same time, the decimation reduces the sample density in each dimension by one-half.

The respective digital samples of $G_0$ are applied through delay means 104 as a first input to subtraction means 106. At the same time, the reduced-density digital samples of $G_1$ are applied to expansion and interpolation filter 108, which increases the sample density of the $G_1$ samples back to that of $G_0$. Then, the expanded density interpolated $G_1$ samples are applied as a second input to subtraction means 106. The presence of delay means 104 ensures that each pair of samples of $G_0$ and $G_1$, which correspond with one another in spatial position, are applied to the first and second inputs of subtraction means 106 in time coincidence with one another. The output stream of successive samples $L_0$ from subtraction means 106 defines the highest spatial frequency in each dimension of the scanned image.

The structure of each of stages 100-2 ... 100-N is essentially the same as that of stage 100-1. However, each of the higher ordinal numbered stages 100-2 ... 100-N operates on lower spatial frequency signals occurring at lower sample densities than its immediately preceding stage. More specifically, the output stream of successive samples $L_1$ represents the next-to-highest octave of spatial frequencies in each image dimension, etc., so that, as indicated in FIG. 1a, the Burt Pyramid analyzed signal is comprised of respective octave sample streams $L_0 \ldots L_{N-1}$ (derived respectively from the subtraction means of each of stages 100-1 ... 100-N) together with a low-frequency remnant signal $G_N$ (derived from the output of the convolution filter and decimation means of stage 100-N).

Figure 1B:
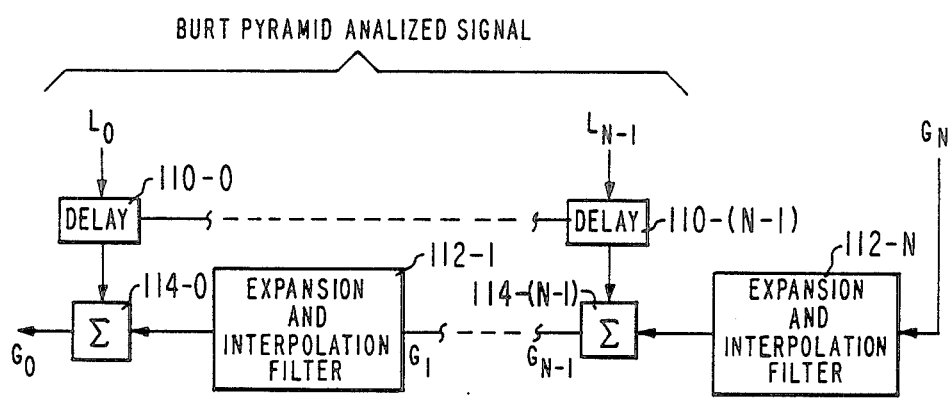

Referring to FIG. 1b, the original signal $G_0$ can be synthesized from the Burt Pyramid analyzed signal by the use of appropriate delay means 110-0 ... 110-(N-1) operating on the sample streams $L_0 \ldots L_{N-1}$, together with expansion and interpolation filters 112-1 ... 112-N and summing circuits 114-0 ... 114-(N-1). As indicated, the lowest density remnant sample stream $G_N$ has its sampling density doubled in each of the image spatial dimensions represented thereby by expansion and interpolation filter 112-N, it is then added to a delayed sample stream $L_{N-1}$ by the summer 114-(N-1). By iteration of this process through successive synthesis stages, the original sample stream $G_0$, defining the two-dimensional image at the highest sampled density, is recovered.

Figure 2A:
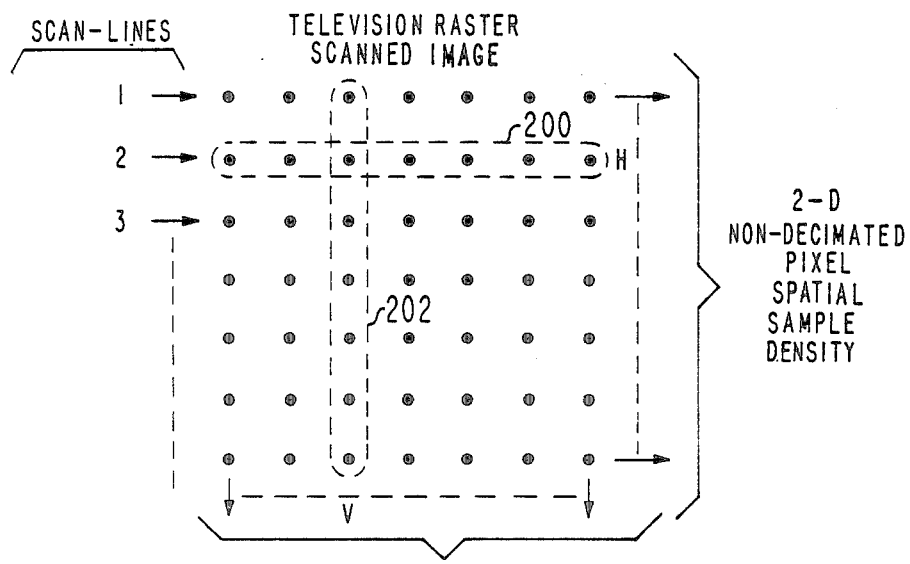
FIGS. 2a and 2b are diagrams illustrating, respectively, two-dimensional (2-D) non-decimated and decimated pixel (picture element) spatial density television-raster scanned images, such as those operated on by the Burt Pyramid analyzer and synthesizer of FIGS. 1a and 1b.
Figure 2B:
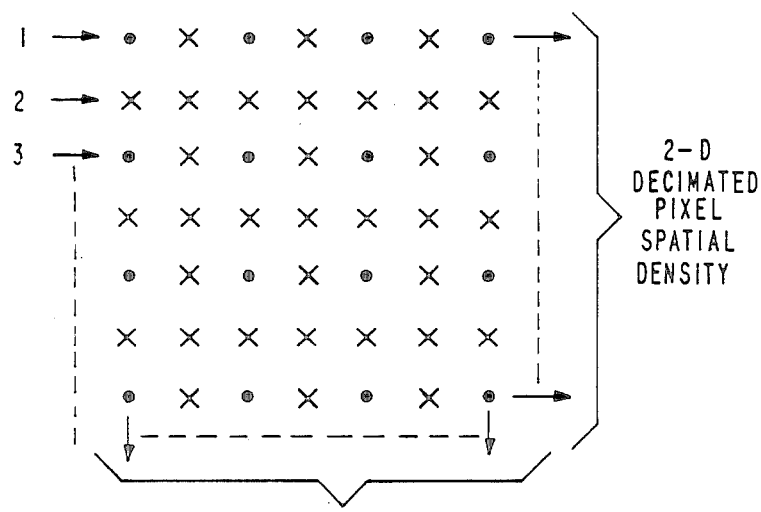

For a better understanding of what is involved in the decimation (or alternatively the expansion) of the pixel spatial sample density of a 2-D raster scanned image, reference is made to FIGS. 2a and 2b. The typical sampling rate for a frame of a television raster scanned image is four times the NTSC color carrier—that is a sampling rate of about 14.32 MHz. Thus, the video signal of each of the active ones of the 525 lines of the raster of each television frame is comprised of approximately 800 samples.

FIG. 2a shows a two-dimensional spatial matrix of image samples arranged in horizontal rows and vertical columns, as is conventional in television, sample rows are horizontally scanned in a predetermined sequence (the sequence being different for progressive scan and interlaced scan). In any case, two spatially adjacent horizontal samples (such as group of horizontal samples 200 of scan line 2) are scanned one after another. However, this is not true of two spatially adjacent vertical samples (such as those contained in vertical column 202 of samples of the television-raster scanned image). The scanning of two vertically adjacent samples of column 202 is temporally separated from one another by the total number of samples in each horizontal scan line (e.g., up to 800 samples).

The Burt Pyramid, employs convolution filters and interpolation filters each utilizing a kernel weighting function having three or more taps corresponding to each dimension thereof. While three taps is the minimum number of required taps, it is preferable that the number of taps corresponding to each dimension thereof be a higher odd integer, such as 5, 7, or 9, for example. Further, in the case of a 2-D image, each filter can be either non-separable or separable. A non-separable 2-D filter employs a single 2-D kernel function. A separable 2-D filter is comprised of two 1-D filters coupled in cascade. Each of the 1-D filters operates on a different one of two orthogonal dimensions (preferably horizontal and vertical) and each employs a 1-D kernel weighting function. In all cases, filtering in the vertical direction requires delay means capable of storing at least (m−1) lines of pixels, where m is the number of kernel function weighting taps in the vertical direction.

The present invention is directed to an improvement in 1-D filters which may be employed as components of separable 2-D filters. Further, in implementing convolution filter and decimation means 102 of the Burt Pyramid analyzer shown in FIG. 1a, it is preferable that the arrangement shown in FIG. 3a be employed. Specifically, species 300 of convolution filter and decimation means 102 is comprised of horizontal (H) convolution filter and decimation means 302 preceding vertical (V) convolution filter and decimation means 304 (rather than vice versa). However, as shown in species 306 of each of the respective expansion and interpolation filters 208 of FIG. 1a and 112-1 ... 112-N of FIG. 1b, V expansion and interpolation filter 308 precedes H expansion and interpolation filter 310 (rather than vice versa). The reason that the arrangements shown in FIGS. 3a and 3b, respectively, are to be preferred, becomes clear from a comparison of the non-decimated pixel spatial sample density shown in FIG. 2a and the decimated spatial density shown in FIG. 2b. As pointed out earlier, each television faster scan line may have as many as 800 pixels. If vertical convolution were to precede horizontal convolution, assuming the vertical filter to be a 7-tap filter, it would be necessary to store (7-1)×800 (i.e., 4800) pixels in delay means of the vertical filter. However, by providing H convolution filter and decimation 302 before the vertical filtering by V convolution filter and decimation 304, the number of pixels per line is reduced from up to 800 to only up to 400. This, by itself, permits the number of pixels needed to be stored by the delay means of the 7-tap convolution filter to be reduced from 4800 to 2400. If the absolute value of the amplitude or level of each pixel is represented by an 8-bit digital number (which is usual in digital image processing), the storage of 2400 pixels still requires 8×2400 (i.e., 19,200) storage elements in the filter delay means. However, even this large number is relatively small when compared to the 38,400 storage elements which would be required if the vertical convolution filter and decimation means preceded the horizontal convolution filter and decimation means.

In the case of expansion and interpolation filtering, the situation is reversed. In FIG. 2b, the symbol "x" is used to indicate each of the respective pixel samples of the non-decimated pixel sampled density shown in FIG. 2a that has been deleted in the decimated pixel sample density of FIG. 2b. Thus, as shown in FIG. 2b every other sample of every odd scan line is deleted, and all the samples of every even scan line are deleted. Therefore, the 2-D decimated pixel spatial sample density of FIG. 2b is only one-fourth of the 2-D non-decimated pixel spatial sample density of FIG. 2a (that is the sample density of the horizontal dimension is reduced by one-half and the sampled density in the vertical dimension is also reduced by one-half). The purpose of the expansion and interpolation in each of these dimensions is to bring the decimated pixel sample density of FIG. 2b back to the non-decimated pixel sample density of FIG. 2a. Therefore, performing the V expansion and interpolation prior to the H expansion and interpolation (as shown in FIG. 3b) makes it possible to store only one-half the number of pixel samples (that is, saving of up to 400 pixel samples for each of the (m−1) delay means of an m tap V expansion and interpolation filter).

Figure 3A:
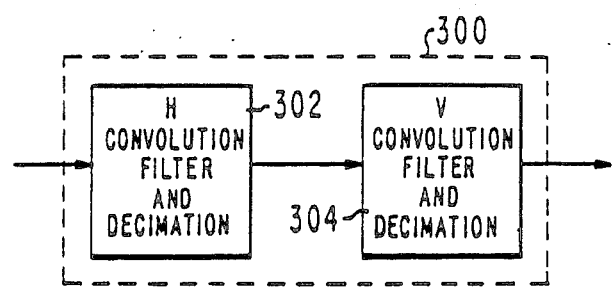
FIG. 3a illustrates one particular species of the convolution filter and decimation means of the Burt Pyramid analyzer of FIG. 1a and FIG. 3b illustrates one particular species of the expansion and interpolation filter means of the Burt Pyramid analyzer of FIG. 1a or the Burt Pyramid synthesizer of FIG. 1b.
Figure 3B:
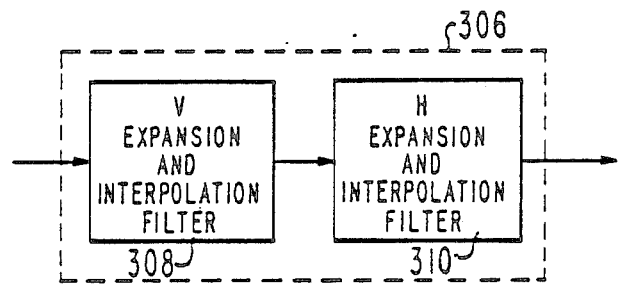

Returning to FIG. 1a, it is plain that the savings to be realized each of stages 100-2 . . . 100-N by employing the arrangement of FIGS. 3a and 3b becomes progressively smaller with respect to the savings to be realized in the first stage 100-1. This is true because the number of pixel samples in each horizontal scan line in each of stages 100-2 . . . 100-N is only one-half of the number of samples in each scan line of its immediately preceding stage. However, the total amount of savings in all N stages is significantly larger than that in only the first stage 100-1.

The purpose of the foregoing discussion is meant to bring out the extremely large amount of bit-storage normally required to implement the Burt Pyramid analyzer and Burt Pyramid synthesizer in real time for the purpose of operating on a television raster scanned image. The use of the present invention in an input-weighted digital filter (although not limited to this use) is particularly suitable for significantly reducing the amount of bit-storage hardware required by a Burt Pyramid analyzer and Burt Pyramid synthesizer of a television-raster scanned image.

Figure 4:
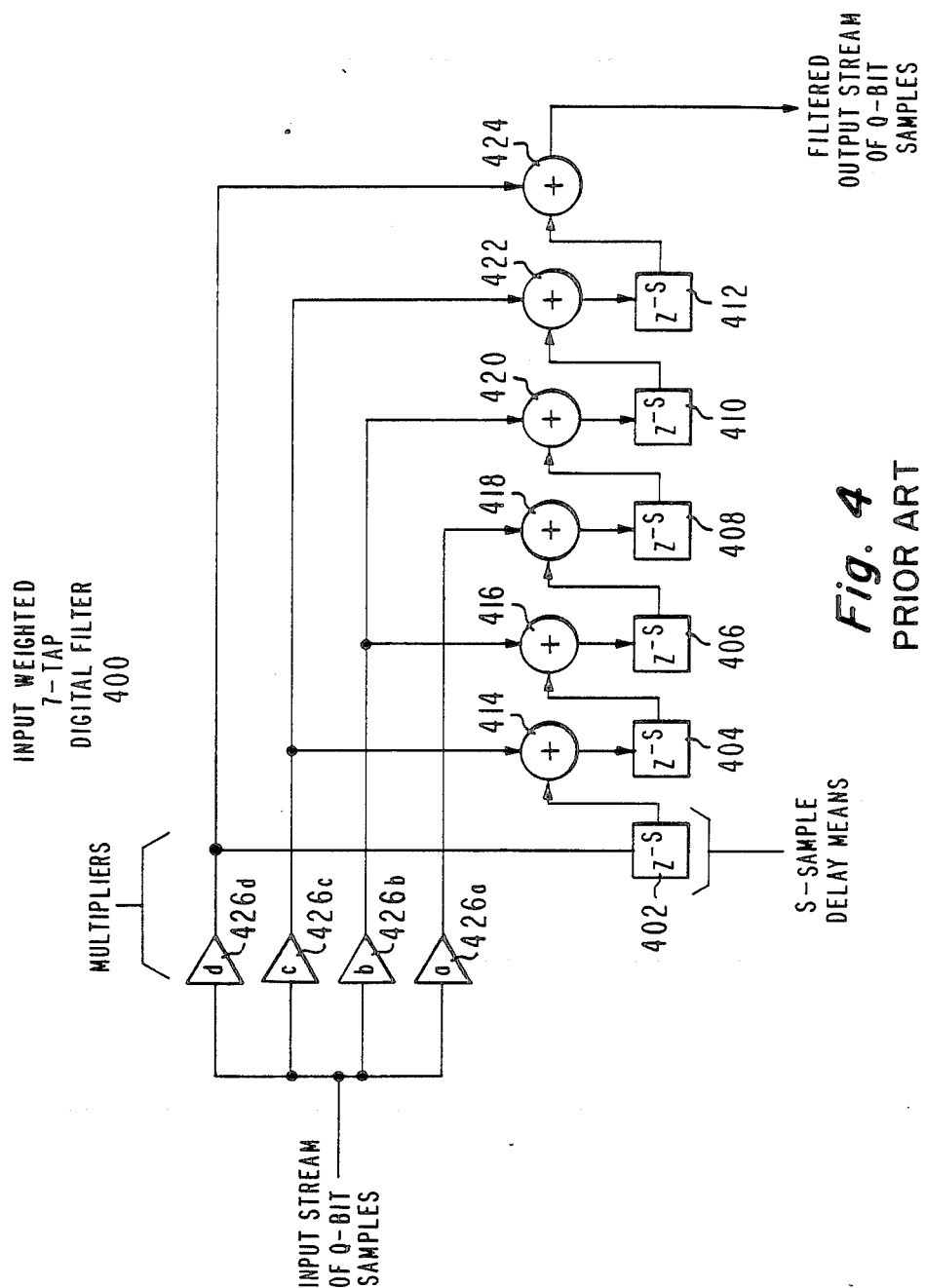
FIG. 4 is a schematic diagram of a prior-art input-weighted seven-tap digital filter.

Reference is made to FIG. 4, which shows a prior art input-weighted 7-tap digital filter 400. Filter 400 is comprised of six S-sample delay means (where S is a given integer) 402, 404, 406, 408, 410 and 412. Each of these delay means is capable of storing S multibit digital numbers, representing the level of each of S successively occurring samples, for a time interval equal to S sample periods. If digital filter 400 were to be employed as an H filter in FIGS. 3a or 3b, each delay means could be comprised of a simple latch. However, in the more important case in which filter 400 is employed as a V filter in FIG. 3a or 3b, s may be a relatively large number (e.g., in the order of hundreds). In this latter case, each delay means may be a serial memory, such as an S-stage shift register, or, alternatively, a random access memory (RAM) having S storage locations.

Filter 400 further comprises six 2-input digital summers 414, 416, 418, 420, 422 and 424. An input stream of Q-bit samples (where Q is a plural integer such as 8) is applied, in parallel as an input to each of respective digital weighting multipliers 426a, 426b, 426c, and 426d. The output from multiplier 426d, which constitutes the first and seventh taps of digital filter 400, is applied directly as an input to delay means 402 and also as a first input to summer 424. The output from multiplier 426c, which constitutes the second and sixth taps of filter 400, is applied as a first input to summer 414 and also as a first input to summer 422. The output from multiplier 426b, which constitutes the third and the fifth taps of filter 400, is applied as a first input to summer 416 and also as a first input to summer 420. The output from multiplier 426a, which constitutes the fourth tap of filter 400, is applied as a first input to summer 418.

Respective outputs of delay means 402, 402, 406, 408, 410 and 412 are applied respectively as second inputs to summers 414, 416, 418, 420, 422 and 424. The respective outputs of summers 414, 416, 418, 420, and 422 are applied respectively as inputs to delay means 404, 406, 408, 410 and 412. The output from summer 424 constitutes the filtered output stream of Q-bit samples.

Figure 5:
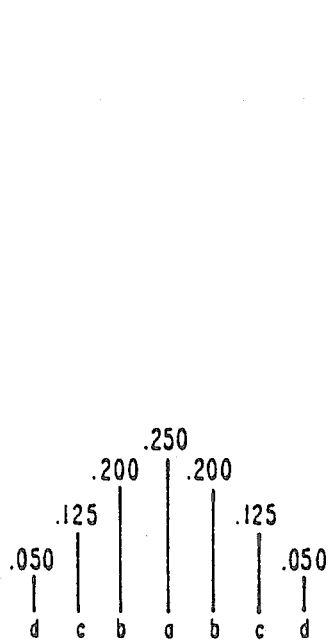
FIG. 5 is an illustrative example of a set of weighting multipliers for the input-weighted filter of FIG. 4.

For illustrative purposes, it is assumed that the respective values of the multipliers a, b, c and d conform with those of the symmetrical 7-tap kernel weighting function shown in FIG. 5. Therefore, the respective values of a, b, c and d are 0.250; 0.200; 0.125; and 0.050. If the maximum level of the dynamic range of levels of the Q-bit input samples of the input stream has a normalized value of unity, then it follows that no Q-bit sample that is input-weighted by the d multiplier 426d can have a normalized level greater than 0.050, the value of d shown in FIG. 5. Similarly, the respective normalized levels of the Q-bit samples weighted by multipliers 426c, 426b and 426a, respectively, can have a value no greater than 0.125, 0.200 and 0.250, the respective values of c, b and a shown in FIG. 5.

Figure 5A:
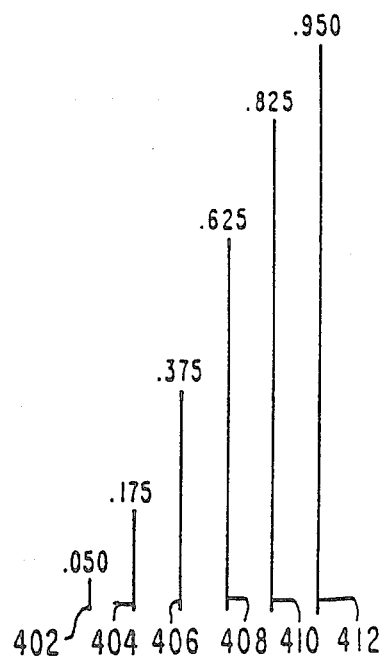
FIG. 5a is a diagram showing the maximum normalized absolute values of the respective inputs to each of the six S sample delay means of the input-weighted filter shown in FIG. 4.

FIG. 5a shows the normalized maximum sample levels required to be stored by each of delay means 402, 404, 406, 408, 410 and 412, respectively. More specifically, the respective values 0.050, 0.175, 0.375, 0.625, 0.825 and 0.950, shown in FIG. 5a, correspond respectively to the values of d, (d+c), (d+c+b), (d+c+b+a), (d+c+2+a), and (d+2c+2b+a). It can be seen that the respective values shown in FIG. 5a follow from the intercoupling arrangement among the delay means and summers of FIG. 4, wherein the output of the d multiplier 426d is applied directly as an input to delay means 402 and the respective outputs of summers 414, 416, 418, 420 and 422 are applied respectively as inputs to delay means 404, 406, 408, 410 and 412.

Based on the respective values shown in FIG. 5a, it becomes apparent that a substantial reduction in storage elements can be achieved in implementing at least delay means 402, (and preferably delay means 404 and 406, in addition). For example, if each Q-bit sample of the input stream is assumed to be an 8-bit sample (often employed to digitally define the level of an image sample in a television picture), the number of bits per sample in each of delay means 402, 404, and 406 can be reduced to a value smaller than 8 bits, with a consequent reduction in number of storage elements required in each of these delay means. More particularly, as shown in FIG. 5b, the number of bits per sample for delay means 402 may be reduced from 8 bits to 4 bits; the number of bits per sample for delay means 406 may be reduced from 8 bits to 6 bits; and the number of bits per sample of delay means 406 may be reduced from 8 bits to 7 bits. The savings in hardware to be realized depends to a great extent on the sample size S of the delay means. In those cases where the sample size S of the delay means is large (on the order of tens or hundreds—such as a 400 sample or even an 800 sample density per scan line, discussed above), the hardware savings of 4 bits per sample or even 1 bit per sample becomes appreciable. In any case, the total number of bits per sample for all 6 delay means 402, 404, 406, 408, 410 and 412 shown in FIG. 5b is reduced to 41 bits from the total of 48 bits usually required in the implementation of these six delay means.

Polyphase filters used for decimation and interpolation with integer changes in sampling rate are known in the art and are generally discussed on pages 79-88 in the book *Multirate Digital Signal Processing*, by C. Rochiere et al., published by Prentice-Hall, Inc. in 1983. Further, as pointed out in the article "The Laplacian Pyramid As A Compact Image Code," by Burt et al., *IEEE Transactions on Communications*, Vol. Com-31, No. 4, April 1983 (pp. 532-540), the Burt Pyramid requires that the kernel weighting function, that is employed either in a convolution filter or in an interpolation filter of the Burt Pyramid, be both symmetric and provide "equal contribution." The term "equal contribution" means that all nodes at a given level of the kernel function contribute the same total weight to nodes at the next higher level. More particularly, if a is the central weighting factor, b is the weighting factor on either side of a, c is the weighting factor on either side of b, d is the weighting factor on either side of c, etc., then the sum of a first set of alternate weighting factors (e.g., $a+2c+2a..$) must equal 0.5 and the sum of a second set of the remaining alternate weighting factors (e.g., $2b+2d+2f...$) also must equal 0.5. Applying this constraint to a 3-tap symmetric filter requires that the value of a be 0.5 and the value of b be 0.25. In the case of a 5-tap symmetric filter, b equals 0.25 and c equals $(0.25-a/2)$. In the case of a 7-tap symmetric filter (used in illustrating the present invention) $b+d=0.25$ and $a/2+c=0.25$.

The above set forth constraints on the weighting factors of the kernel function employed in the Burt Pyramid permits use of input-weighted polyphase filters to be employed for further reducing the bit storage elements required to implement both a convolution filter decimator and an expander interpolation filter of the type employed in the Burt Pyramid analyzer and synthesizer.

Figure 6:
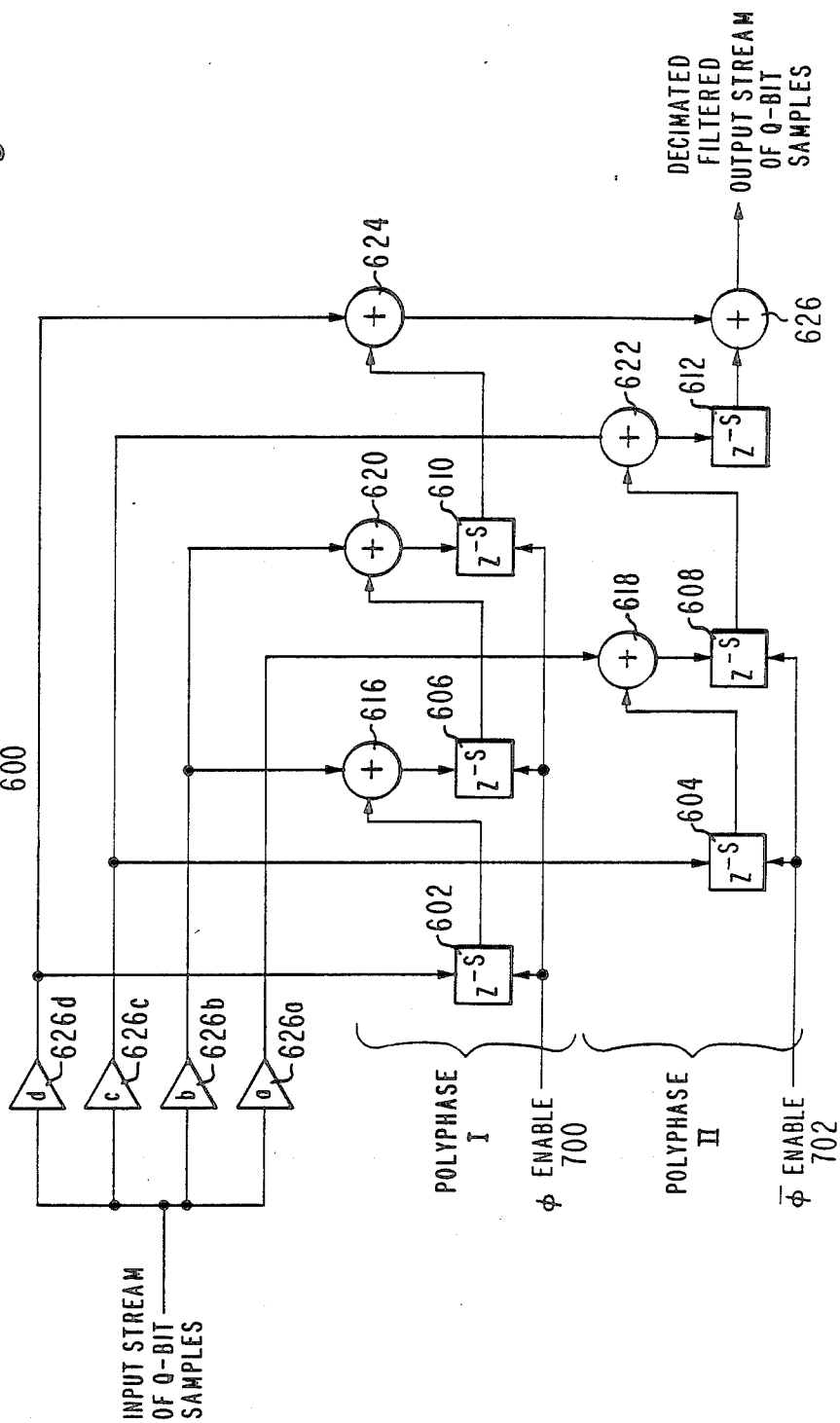
FIG. 6 is a schematic diagram of an input-weighted seven-tap digital polyphase convolution filter decimator that comprises a first preferred embodiment of the present invention.

The respective values of a, b, c and d of the kernel weighting function shown in FIG. 5 have been selected to conform to the constraints of the Burt Pyramid discussed above. FIG. 6 shows an input-weighted 7-tap digital polyphase convolution filter decimator that may employ the kernel weighting function of FIG. 5. In FIG. 6, the respective input stream of Q-bit samples, the respective a, b, c and d multipliers, the respective S-sample and delay means and the respective summers are each individually identical to the corresponding elements discussed above in connection with FIG. 4. However, the intercoupling arrangement among the delay means and the summers and the timing control of the delay means in FIG. 6 is different from that discussed above in connection with FIG. 4. More specifically, the six respective S-sample delay means 602, 604, 606, 608, 610 and 612 are divided (as shown in FIG. 6) into a polyphase 1 component filter and a polyphase ii component filter. Delay means 602, 606 and 610 (of which the polyphase i component filter is comprised) are associated with only the d and b multipliers (derived from the outputs of multipliers 626d and 626b). Delay means 604, 608 and 612 (of which the polyphase ii component filter is comprised) are associated with solely the c and a multipliers (derived from the outputs of multipliers 626c and 626a). More specifically, the output from d multiplier 626d is applied directly as an input to delay means 602 of the polyphase i component filter and the output of c multiplier 626 is applied directly as an input to delay means 604 of the polyphase ii component filter. Furthermore, the output of b multiplier 626b is applied as a first input to respective summers 616 and 620 of the polyphase i component filter and the output of d multiplier 626d is applied as a first input to summer 624 of the polyphase i component filter. The output of a multiplier 626a is applied as a first input to summer 618 of the polyphase ii component filter and the output of c multiplier 626c is applied as a first input to summer 622 of the polyphase ii component filter. At the same time, the respective outputs of delay means 602, 606 and 610 of the polyphase i component filter are respectively applied as second inputs to summers 616, 620 and 624 of the polyphase i component filter. Similarly, the respective outputs of delay means 604 and 608 are respectively applied as second inputs to summers 618 and 622 of the polyphase ii component filter.

In FIG. 4 each of the delay means 402, 404, 406, 408 and 412 is always enabled and, therefore, is responsive to applied samples at all times. In the case of FIG. 6, the respective delay means 602, 606 and 610 of the polyphase i component filter are only enabled during the enable portion of $\phi$ enable timing control signal 700 shown in FIG. 7. Similarly, delay means 604 and 608 of the polyphase ii component filter are only enabled during the enable portion of $\bar{\phi}$ enable timing control signal 702 shown in FIG. 7. As indicated in FIG. 7, $\phi$ enable timing control signal 700 is a square wave comprised of alternate enable portions and disable portions with the durations of each of these portions being a time interval during which S successive samples occur. $\bar{\phi}$ enable timing control signal 702 is a square wave having a phase that is inverted with respect to the $\phi$ enable timing control signal 700, so that the "disable" S-sample interval of the $\phi$ enable timing control 702 occurs isochronously with an "enable" S-sample interval of $\phi$ enable timing control signal 700 and each "enable" S-sample interval of $\bar{\phi}$ enable timing control signal 702 occurs isochronously with a "disable" S-sample interval of $\bar{\phi}$ enable timing control signal 700.

The effect of $\phi$ enable timing control signal 700 on delay means 602, 606 and 610 is to render the polyphase i component filter operative only during a set of alternate S-sample intervals of the input stream of samples. At the same time, the effect of the $\bar{\phi}$ enable timing control signal 702 on delay means 604 and 608 is to render the polyphase ii component filter operative only during a set of remaining S-sample intervals of the input stream of samples.

The output of the polyphase i component filter is derived at the output of summer 624 and the output of polyphase ii component filter is derived at the output of summer 622. However, the respective outputs of the polyphase i and the polyphase ii component filters are offset from each other in time by one S-sample interval. To derive a decimated filtered output stream of Q-bit samples, it is necessary to sum corresponding samples from the respective outputs of the polyphase i and polyphase ii component filters. However, before this can be done, it is necessary to bring the corresponding samples into time alignment with one another. In order to do this, delay means 612, which is enabled at all times, delays the output from the polyphase ii component filter (appearing at the output of summer 622) by one S-sample interval. Summer 626 adds the output of the polyphase i component filter applied as a first input thereto to the delayed output from polyphase ii component filter applied as a second input thereto. A decimated filtered output stream of Q-bit samples is at the output of summer 626.

FIG. 8a shows the respective normalized maximum sample levels stored in each of the respective delay means of the polyphase i component filter and the polyphase ii component filter of convolution-filter decimator 600. As indicated in FIG. 8a, the respective nominal maximum values of the sample levels stored in each of delay means 602, 606 and 610 of the polyphase I component filter are 0.050, 0.250 and 0.450, respectively. Also, the respective nominal maximum values of the sample levels stored in each of delay means 604, 608 and 612 of the polyphase II component filter are 0.125, 0.375 and 0.500, respectively. The information provided by FIG. 8a with respect to input-weighted 7-tap digital phase convolution filter decimator 600 of FIG. 6 corresponds with the information provided by FIG. 6 corresponds with the information provided by FIG. 5a with respect to the input-weighted 7-tap filter 400 of FIG. 4. The comparison of the respective values shown in FIG. 8a associated with delay means 602, 604, 606, 608, 610 and 612 of convolution filter decimator 600 with the corresponding respective values shown in FIG. 5a associated with delay means 402, 404, 406, 408, 410 and 412 of filter 400, reveals that the respective values associated with each of delay means 604, 606, 608, 610 and 612 in FIG. 8a are significantly smaller than the respective values associated with each of the corresponding delay means 404, 406, 408, 410 and 412 of FIG. 5a. Only the smallest value 0.050 associated with delay means 602 of FIG. 8a is equal to the smallest value 0.050 associated with delay means 402 of FIG. 5a.

The aforesaid significantly lower values in five out of the six delay means shown in FIG. 8a with respect to those shown in FIG. 5a provide a relatively large reduction in the amount of bit-storage per sample required by delay means 604, 606, 608, 610 and 612 with respect to that required by the corresponding delay means 404, 406, 408, 410 and 412. More specifically, as shown in FIG. 8b, respective delay means 602, 606 and 610 of the polyphase I component filter require, respectively, four, six and seven bits per sample, while respective delay means 604, 608 and 612 of the polyphase II component filter require, respectively, five, seven and seven bits per sample. Thus, the total number of bits per sample required by all of delay means 602, 604, 606, 608, 610 and 612 of both the polyphase I and II component filters of convolution filter decimator 600 of FIG. 6 is only 36 (rather than a total of 41 required by all of delay means 402, 404, 406, 408, 410 and 412 of filter 400 of FIG. 4).

Figure 9:
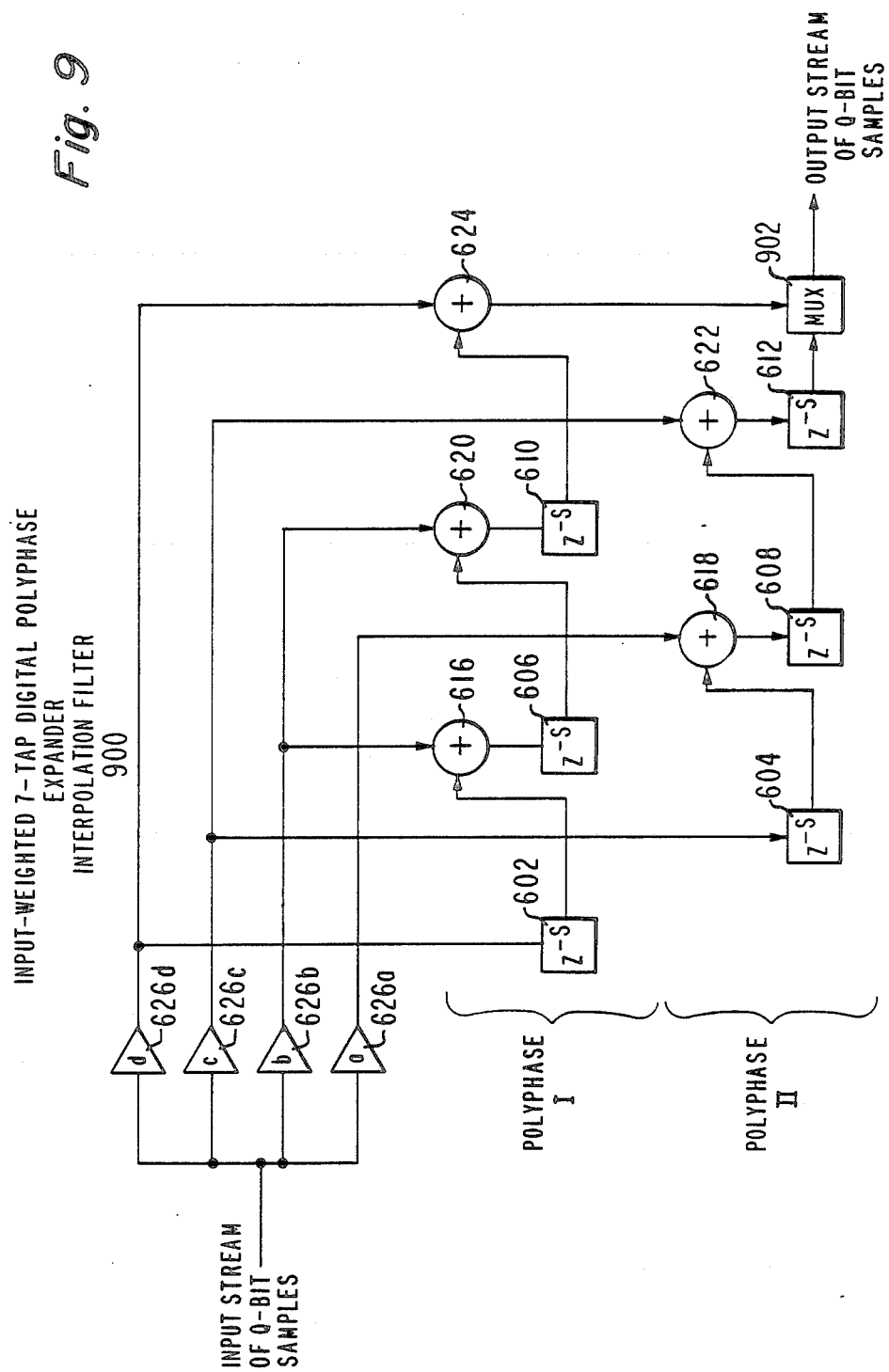
FIG. 9 is a schematic diagram of an input-weighted seven-tap digital polyphase expander interpolation filter that comprises a second preferred embodiment of the present invention.

Reference is now made to input-weighted 7-tap digital polyphase expander interpolation filter 900 shown in FIG. 9. The stream of Q-bit samples shown in FIG. 9 is an intermittent stream made up of respective S-sample intervals each followed by a null interval that is at least as long as the S-sample interval that precedes it. Preferably, as shown in FIG. 10, the length of null interval 1000 is equal to that of the S-sample interval 1002 that immediately precedes it, but null interval 1000 may be longer (but not shorter) than its immediately preceding S-sample interval 1002.

Each S-sample interval 1002, which is comprised of S successive samples, may, by way of example, represent the samples in each odd scan line of the 2-D decimated pixel spatial density shown in FIG. 2b. Null interval 1000 may, by way of example, represent each decimated even scan line of the 2-D decimated pixel spatial density shown in FIG. 2b. In any case, the duration of null interval 1000 must be sufficiently long so that all of the S-samples in an S-sample interval 1002, after being delayed by at least one S-sample interval, falls entirely within null level 1000.

With two exceptions, the structure of expander interpolation filter 900 of FIG. 9 is identical to that of convolution filter decimator 600 of FIG. 6. The first exception is that respective delay means 602, 606 and 610 of the polyphase I component filter are enabled at all times (so that the $\phi$ enable control signal employed in FIG. 6 is not required) and delay means 604 and 608 (in addition to delay means 612) of the polyphase II component filter are enabled at all times (so that the $\bar{\phi}$ enable control signal 702 is not required). The second exception is that in FIG. 9 multiplexer (MUX) 902 replaces summer 626 of FIG. 6. The purpose of MUX 902 is to interleave the group of S samples occurring during each S-sample interval of the output of the polyphase I component filter with the group of S samples occurring during each S-sample interval of the output of polyphase II component filter. However, each of the group of S successive samples of each S-sample interval occur at the output of summer 624 of polyphase I component filter in time coincidence with the occurrence of the corresponding sample of the group of S successive samples of that S-sample interval at the output of summer 622 of the polyphase II component filter. Therefore, it is necessary to pass the output from summer 622 through delay means 612 (which provides a delay of one S-sample interval) in order that the inputs to MUX 902 occur in the proper interleaved relationship with respect to one another. Thus, all of the samples at the output of delay means 612 occur during a null interval at the output of summer 624, and vice versa.

Neither of these two exceptions in structural similarity between expander interpolation filter 900 of FIG. 9 and convolution filter decimator 600 of FIG. 6 affects the respective relationships shown in FIGS. 8a and 8b, discussed in detail above in connection with FIG. 6. Therefore, the benefits of the present invention with respect to the reduction of storage elements required by each of the respective delay means 602, 606 and 610 of the polyphase I component filter and each of delay means 604, 608 and 612 of polyphase II component filter (shown in FIG. 8b) apply with equal force to expander interpolation filter 900 of FIG. 9 as they do to convolution filter-decimator 600 of FIG. 6, discussed above.

I claim:

1. In an m-tap input-weighted digital filter (where m is a first integer of three or more) responsive to an input stream of successive digital samples for deriving a filtered output stream of successive digital samples; wherein;
- (a) each of said input and output digital samples is defined by Q-bits (where Q is a second given integer of three or more);
- (b) each of said input digital samples is applied to a first of the m taps of said filter, and the relative weight of the first of the m taps of said filter is no greater than one-fourth, thereby deriving a stream of weighted input digital samples for the first of the m taps;
- (c) at least each of a subset of the m taps that include the first of the m taps has individually associated therewith a delay means for storing each of S successive digital samples for a given time interval (where S is a third given integer), the delay means individually associated with the first of the m taps having each of said stream of weighted input digital samples applied as an input thereto; and
- (d) at least the delay means individually associated with the first of the m taps for storing digital samples defined by no more than Q'-bits (where Q' is any integer having a value that is smaller than that of the second given integer Q and yet is large enough to store all the significant bits of each weighted input digital sample);

the improvement wherein said filter is comprised of:
a first component polyphase input-weighted filter responsive to at least a first portion of said input stream, said first component filter having respective taps which comprises solely all the odd ones of said m-taps of said filter, the sum of the weights of all said odd ones of said m-taps having a value substantially equal to one-half and an individual one of said S-sample delay means associated with at least each but the last of said odd ones of said m-taps;
a second component polyphase input-weighted filter responsive to at least a second portion of said input stream, said second component filter having respective taps which comprises solely all the even ones of said m-taps of said filter, the sum of the weights of all said even ones of said m-taps having a value substantially equal to one-half an individual one of said S-sample delay means associated with at least each but the last of said even ones of said m-taps, and at least the delay means individually associated with the first of said even ones of said m-taps for storing digital samples defined by no more than Q'-bits; and
combining means coupled to both the last of said odd ones of said m-taps of said first component polyphase filter and the last of said even ones of said m-taps of said second component polyphase filter for deriving said filtered output stream of successive digital samples of said input-weighted digital filter.

2. The improved input-weighted digital filter defined in claim 1 wherein:
said input stream of successive digital samples is comprised of an ordinal series of successively-occurring sample groups each of which groups contains S successive digital samples that occur within a time interval no longer than said given time interval;
said improved input-weighted digital filter includes control means for applying as said first portion of said input stream the S samples in each odd one of said ordinal series of sample groups as an input to said first component polyphase filter and for applying as said second portion of said input stream the S samples in each even one of said ordinal series of sample groups as an input to said second component polyphase filter; and
said combining means includes an additional S-sample delay means coupled to the output of a selected one of said first and second component polyphase filter for providing a relative delay between said selected and non-selected outputs of said first and second component polyphase filters, that is sufficient to bring the respective times of occurrences of corresponding samples of corresponding selected and non-selected S-sample groups into time coincidence with one another, and means for digitally summing each pair of time-coincident samples to derive thereby said filtered output stream of successive digital samples;
whereby said improved input-weighted digital filter operates as an embedded filter-decimator.

3. The improved input-weighted digital filter defined in claim 2, wherein the third given integer S is an integer having a value of at least two.

4. The improved input-weighted digital filter defined in claim 3, wherein the third given integer S has a value of at least ten.

5. The improved input-weighted digital filter defined in claim 4, wherein the third given integer S has a value of at least one hundred.

6. The improved input-weighted digital filter defined in claim 1, wherein:
said input stream of successive digital samples is comprised of an ordinal series of time-separated sample groups, each of which groups contains S successive digital samples that occur within a first time interval that is no longer than said given time interval, and successive sample groups are separated by a second time interval that is at least as long as said first time interval;
said improved input-weighted digital filter includes means for applying said input stream as an input to both said first and to said second component polyphase filters;
said combining means includes an additional S-sample delay means coupled to the output of a selected one of said first and second component polyphase filters for providing a relative delay between said selected and non-selected outputs of said first and second component polyphase filters sufficient to (1) bring the respective times of occurrences of all the samples of each S-sample group of said delayed selected output within the occurrence of a second time interval of said non-selected output and (2) bring the respective times of occurrences of all the samples of each S-sample group of said non-selected output within the occurrence of a second time interval of said delayed selected output; and
multiplexer means for interleaving said delayed selected output with said non-selected output of said first and second component polyphase filters;
whereby said improved input-weighted digital filter operates as an embedded expander-interpolation filter.

7. The improved input-weighted digital filter defined in claim 6, wherein:
the delay provided by said additional S-sample delay means provides a relative delay between said selected and non-selected outputs of said first and second component polyphase filters equal to said first time interval.

8. The improved input-weighted digital filter defined in claim 7, wherein:

said first and second time intervals are equal to one another.

9. The improved input-weighted digital filter defined in claim 8, wherein the third given integer s is an integer having a value of at least two.

10. The improved input-weighted digital filter defined in claim 9, wherein the third given integer S has a value of at least ten.

11. The improved input-weighted digital filter defined in claim 10, wherein the third given integer S has a value of at least one hundred.

* * * * *